(12) United States Patent
Davis et al.

(10) Patent No.: US 7,207,430 B2
(45) Date of Patent: Apr. 24, 2007

(54) VACUUM GRIPPER FOR HANDLING SMALL COMPONENTS

(75) Inventors: Peter Davis, Santa Cruz, CA (US); Dean Tarrant, San Jose, CA (US)

(73) Assignee: UI Holding Company, Conklin, NY (US)

( * ) Notice: Subject to any disclaimer, the term of this patent is extended or adjusted under 35 U.S.C. 154(b) by 325 days.

(21) Appl. No.: 10/973,037

(22) Filed: Oct. 25, 2004

(65) Prior Publication Data

US 2006/0088625 A1    Apr. 27, 2006

(51) Int. Cl.
*B65G 47/00* (2006.01)
(52) U.S. Cl. .................. 198/468.4; 198/476.1
(58) Field of Classification Search ........... 198/689.1, 198/482.1, 468.4, 471.1, 474.1, 476.1
See application file for complete search history.

(56) References Cited

U.S. PATENT DOCUMENTS

| | | | | | |
|---|---|---|---|---|---|
| 3,616,942 | A | * | 11/1971 | Gruber | ............ 198/471.1 |
| 4,352,775 | A | * | 10/1982 | Magerle | ............ 264/500 |
| 4,735,761 | A | * | 4/1988 | Lindenberger | ............ 198/471.1 |
| 5,165,521 | A | * | 11/1992 | Schweitzer et al. | ...... 198/482.1 |
| 5,976,306 | A | | 11/1999 | Davis et al. | |
| 6,173,750 | B1 | | 1/2001 | Davis et al. | |
| 6,554,128 | B1 | | 4/2003 | Davis et al. | |
| 6,773,543 | B2 | | 8/2004 | Summers | |
| 6,880,694 | B2 | | 4/2005 | Sowden | |

* cited by examiner

*Primary Examiner*—James R. Bidwell
(74) *Attorney, Agent, or Firm*—Duane C. Basch; Basch & Nickerson LLP

(57) ABSTRACT

The present invention is a method and apparatus for use within a die feeder associated with a circuit board assembly machines and includes, among other aspects and features, a cavity to capture and maintain the position of the die within a vacuum gripper. The invention also includes the interaction of a pair of nozzles whereas one moves within the nozzle tip containing the die cavity and has the ability to compensate for any offset between the nozzles.

16 Claims, 7 Drawing Sheets

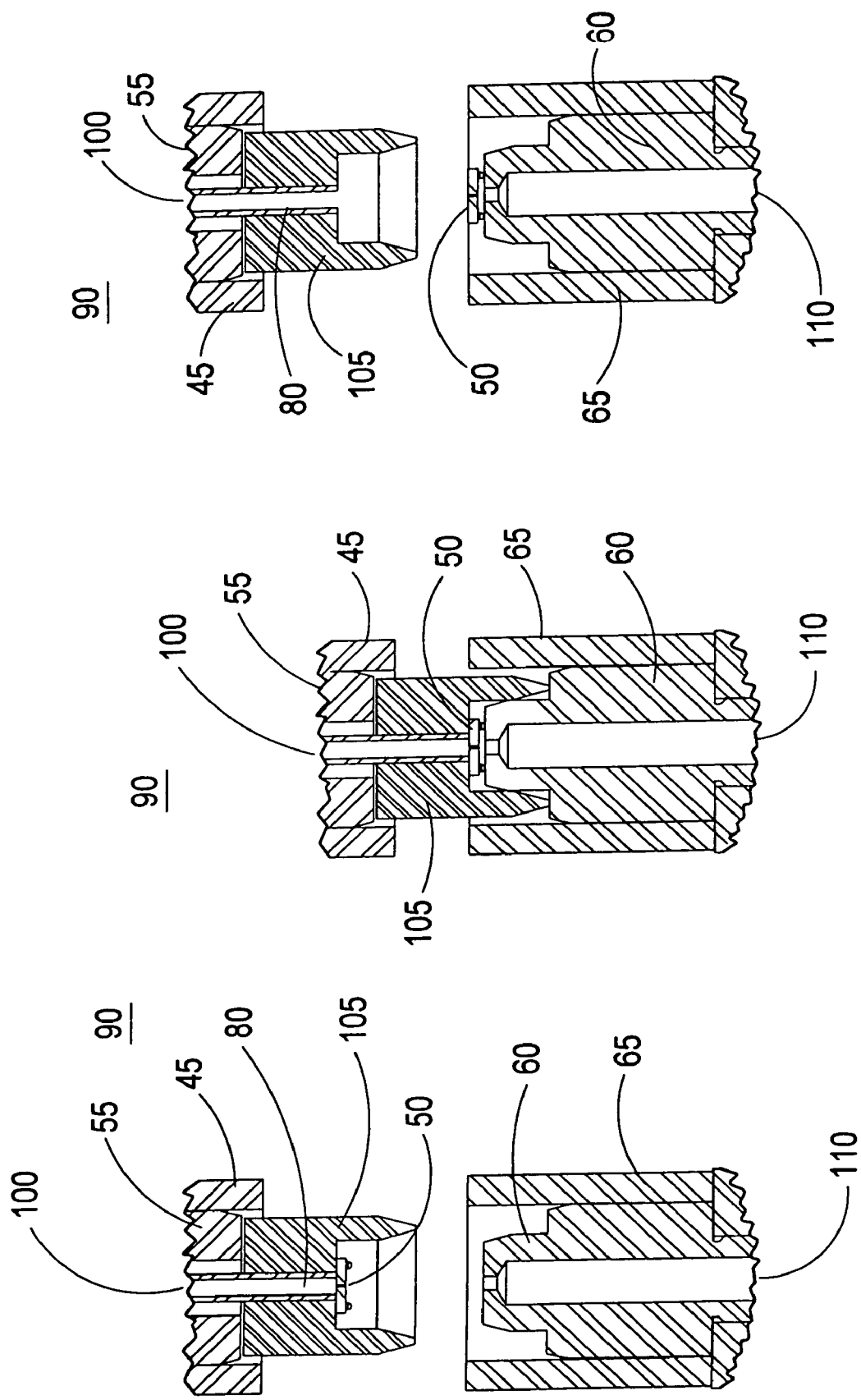

VACUUM GRIPPER FOR HANDLING SMALL COMPONENTS

This invention relates generally to the handling of components by pneumatic nozzles within die feeders used with circuit board assembly equipment requiring the presentation of small components and more particularly to a die transferring apparatus for a die feeder suitable for reliably handling small components using a vacuum gripper.

INCORPORATION BY REFERENCE

Incorporated herein by reference for their teachings are U.S. Pat. No. 5,976,306 issued Nov. 2, 1999, U.S. Pat. No. 6,173,750: issued Jan. 16, 2001, U.S. Pat. No. 6,554,128 issued Apr. 29, 2003, and U.S. Pat. No. 6,773,543 issued Aug. 10, 2004, all of which are assigned to the assignee of the instant application.

BACKGROUND OF THE INVENTION

Heretofore, there have been many designs for devices to pick up an object utilizing a suction tube with an applied vacuum. In general, such vacuum pickup devices have been designed with an open ended cylinder having a nozzle surface which seals to the object to accomplish the physical attachment. However, the nozzle of the vacuum pickup device is generally lacking any means to locate or position the object onto a vacuum nozzle and thereby requires the utilization of sophisticated alignment monitors and location/position correction capabilities.

A further problem arises in the use of traditional pick-up nozzles for holding and transferring very small components. This problem is exacerbated when components such as die on a microscopic scale must be handled. Moreover, when such components must be passed between vacuum nozzles, a cumulative positioning error may be generated. Or, as is sometimes the case, the component or die is lost altogether as it was being transferred between nozzles.

As used herein the term "die," or more specifically microscopic die, is intended to include various electrical, electromechanical, mechanical or other components, and particularly includes those that may be formed through a wafer processing technique and subsequently separated into discrete components. As such, die are not limited to semiconductor components, but may be any similar devices such as mirrors, micro-electro-mechanical systems (MEMS), micro-optical electrical module (MOEM) which are formed there upon a wafer and presented in the same manner as semiconductor components. Furthermore, a die contained on a wafer may include post processing features such as, but not limited to, chip scale packaging (CSP), wafer level processing (WLP) as well as passivation and underfill layers.

Pick-up vacuum nozzles currently utilized in automated assembly equipment for picking up and moving larger die from a source to a destination are often ineffective for reliably maintaining the aspect and relative position of smaller, microscopic die. For example, in assembling printed circuit boards, bare die are acquired from a wafer by a pick nozzle contained in a die feeder and are subsequently transferred to a pick-up location. The traditional pick nozzle is connected to a vacuum source which may be actuated by any of a number of devices, including a pneumatic valve. The pick nozzle is extended to contact the wafer at which time vacuum is applied to the nozzle and in turn a bare die is acquired and securely captured by the nozzle. The pick nozzle is often associated with a mechanism to turn the die over along an axis parallel to the plane of the wafer and is then moved into position to be received by yet another nozzle for subsequent delivery to a circuit or printed wiring board assembly machine.

In one such embodiment an intervening nozzle is used to accommodate the turning over of the die prior to being transferred onto the presentation nozzle for delivery to the assembly machine. This additional die transfer operation is implemented when the die is to be placed circuit side down onto the board or substrate; this is commonly referred to in the art as a "flip chip" component, where the circuits on the die face align with the printed circuits on the board. In the alternative, the die is presented with the circuit facing away from the printed circuit board (PCB) and is electrically interconnected with fine wires that are subsequently bonded between pads on the PCB and the die.

While the die is being transitioned between a pair of nozzles it is necessary to maintain the position of the die within the centerline of the feed path. Once the nozzles are in contact with opposing surfaces of the die, the vacuum is released from one and applied to the other, thus passing the holding control of the die therebetween with minimal, if any, control of the x, y locations or angular orientation (theta) relative to a nozzle. Furthermore, in order to facilitate a rapid hand-off of the die, it is often necessary to overcome an inherent hysteresis within the nozzle pneumatics, as well as the natural die adhesion to the nozzle tip. Accordingly, in order to accelerate the transfer of a die in a high speed circuit board assembly systems, the holding vacuum is switched to a positive air pressure to release, or "blow", the die off the releasing nozzle. Generally a settling time delay is employed before the die transfer is completed, in order to settle the turbulent air around the die before the nozzles are retracted.

However, in the handling of microscopic die having a minuscule mass and surface area, the aerodynamic performance of the die is highly unpredictable—even when the die is in simultaneous contact with the nozzles. The possibility of a disturbance of die alignment, particularly as a result of turbulent air flow created by the blow-off step described above, becomes a significant limitation. Unfortunately, the obvious solution of increasing the "settling" time delay is not practical due to the negative impact on the throughput of such systems (measured in die/sec). Furthermore, with the introduction of a die having a surface area of about 0.25 $mm^2$ or less, the vacuum holding force is minimal at transfer, and often results in the die becoming displaced from the center line of the nozzle at the time the vacuum is switched to pressure. In the case where the die becomes dislocated on the nozzle tip a vacuum seal might not occur relative to the receiving nozzle, thereby compromising the control of the die and resulting in the potential for the die being dropped or mishandled.

SUMMARY OF THE INVENTION

In light of the afore-described concerns relative to conventional die-handling devices, the present invention relates generally to the handling of components using pneumatic nozzles. More particularly, the invention relates to a die transferring apparatus using a vacuum gripper, where interaction between a die supplying or releasing nozzle and a die receiving nozzle is more controlled. Specifically, just prior to the transition of the die from one to the other, the nozzles engage one within another in a mating fashion, to assure transfer of the die and consistent alignment (location and/or orientation). Additionally, at the moment of transfer, the die is captivated or captured within a region defined by the pair of engaged nozzles so as to preclude any loss of the die therefrom.

The present invention is an improvement of die or component handling methods used with die feeders in automated pick-and-place circuit board assembly machines and in particular those assembly systems requiring the manipulation and placement of numerous small die or components at high speeds. The present invention includes, among other aspects and features, a cooperative interaction of the die transferring tips of a pair of nozzles.

This present invention is considered a significant improvement over the known methods of transporting a die from a wafer to a pick up location for the circuit board assembly machine. In many applications, traditional nozzles have proven to be unsatisfactory when conveying die or components having dimensions of less than about 1.0 mm$^2$ for two basic reasons; (i) the tolerance for nozzle tip alignment must be less than half the minimum die dimension and (ii) the die must be constrained as it passes between nozzles. To overcome this problem the present invention causes a die to reside within a transfer cavity defined by the mated nozzle tips whereby during the transfer process the nozzles are guided into alignment by virtue of an aligning feature, such as a chamfer, on the contacting surfaces of the supply and receiving nozzles and the die is mechanically constrained as it is blown off the supplying nozzle surface and sucked onto the surface of the receiving vacuum nozzle.

In accordance with the present invention a high speed die delivery or feeding system can have one or more of at least three die transfer operations; (i) die extraction from the wafer; (ii) die flipping; and/or (iii) die transfer (e.g., to a shuttle or similar receiving device). As described herein, the specific sub-systems of a die feeder have specific tolerances to accept and present die while maintaining orientation and position of the die during the transfer or similar hand-off operations (e.g., die acquisition from the wafer, die flipping and lastly die transporting to the pick and place assembly machine used for high-speed circuit board manufacturing). The direct die feeder disclosed in U.S. Pat. No. 6,173,750, and incorporated herein by reference in its entirety, generally relies on conventional pick nozzles having a planar forward surface whereby a vacuum seal on the face of the die is the sole means to reliably secure, index and transfer the die throughout the die handling process. It is further appreciated, therefore, that motion devices are required to move the nozzles to and from one another (acquisition, mating and similar positions) to effect transfer of a die from one location to another.

In accordance with the present invention, there is provided a die transferring device such as a vacuum gripper having a nest or cavity within its nozzle tip. The nest or cavity assures that the die transferring device accurately maintains the position of a die relative to the vacuum gripper and releases the die onto a mating nozzle, without allowing the die to move appreciably or become dislocated from the nozzles within the vacuum gripper.

One aspect of the invention is based on the discovery of techniques for nozzles to cooperatively interact, whereby one nozzle mates within the other in order to ensure that the die supplying nozzle is co-linear with the receiving nozzle. In order to adjust for any offset or interference between the nozzles during engagement the contacting or mating surfaces are chamfered, thereby having inclined contacting surfaces to guide the supply nozzle relative to the receiving nozzle. As a result of the mating surfaces a bending moment may be produced on a nozzle stem to displace the nozzle and compensate for any misalignment during the engagement of the nozzles with the die therebetween.

BRIEF DESCRIPTION OF THE DRAWINGS

FIG. 3A is a cross sectional view showing a die staged for transfer from the cavity nozzle to the mating nozzle;

FIG. 3B demonstrates the interaction of the nozzles at the time of transfers;

FIG. 3C shows the completed transfer of the die onto the mating nozzle;

Figure 1C:
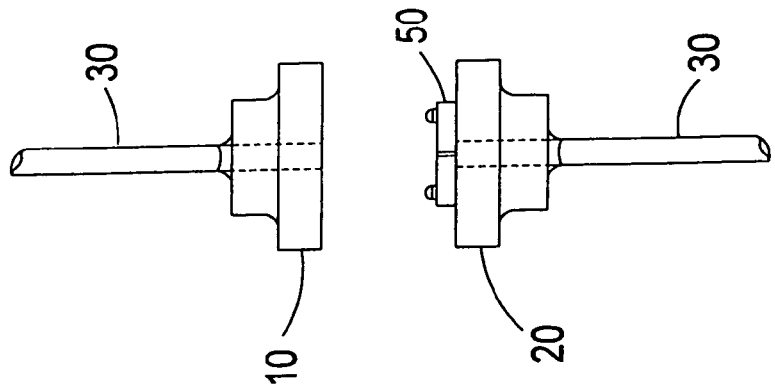
FIGS. 1A, 1B, and 1C are planar views of the prior art nozzle transfer method

The present invention will be described in connection with a preferred embodiment. However, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements.

Figure 6:
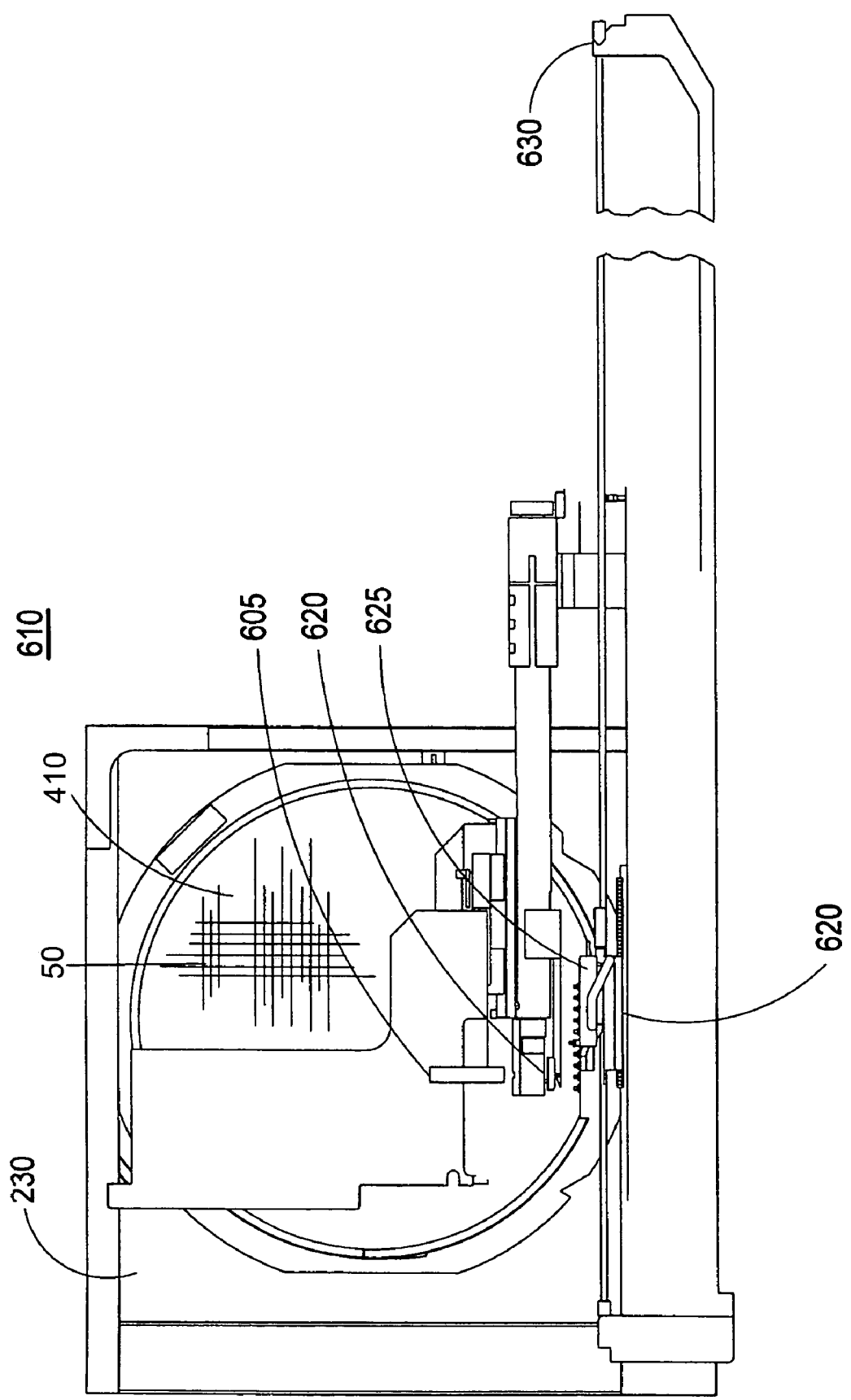
FIG. 6 is an illustrative representation of a die feeder suitable for an embodiment of the present invention.

Illustrated in FIG. 6 is a high speed die delivery system 610 that performs several of the at least three die transfer operations; (i) a die extraction function, where a die 50 is extracted from the wafer 410; (ii) a die flipping maneuver, where the orientation of die 50 is reversed top-for-bottom; and/or (iii) a die to shuttle transfer, where a die 50 is placed onto a receiving nozzle on shuttle 430. As will be appreciated, and as described in detail in U.S. Pat. No. 6,173,750, hereby incorporated by reference, the die feeder 610 is operatively disposed to provide a continuous flow of die for retrieval by an associated assembly system so as to assure the reliable delivery of die for use by the assembly system. It will be further appreciated that while feeder 610 may employ a processor or similar control circuitry to carry out the operations described herein, these functions will be synchronized with the assembly system and that the feeder and the assembly system may exchange various control and data signals via an interface (not shown). Furthermore, although the direct die feeder of FIG. 6 provides an embodiment of the present invention, it will be appreciated that aspects of the invention may be applied to various alternative embodiments including, but not limited to, wafer processing systems, bulk-die retrieval and placement systems, component tape feeding system and in particular systems for loading of die into component tapes.

Figure 1B:
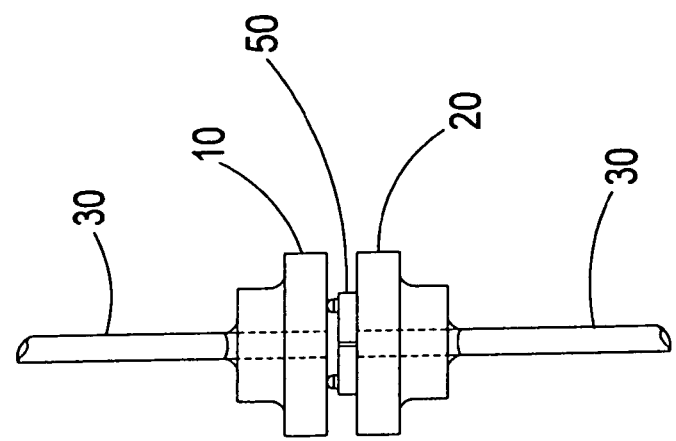
Figure 1A:
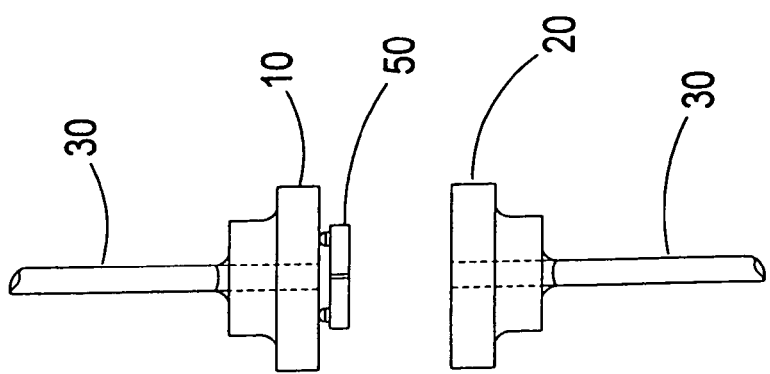

Referring also to prior art FIGS. 1A, 1B and 1C, a conventional component delivery nozzle 10 and receiving nozzle 20 are shown attached to pneumatic tube 30. Die 50 is secured to delivery nozzle 10 in an arbitrary position with vacuum supplied through pneumatic tube 30. FIG. 1B depicts delivery nozzle 10, receiving nozzle 20 and die 50 in contact with one another. Once the vacuum is removed from delivery nozzle 10 and applied receiving nozzle 20 the die remains with receiving nozzle 20 in an arbitrary position as both nozzles are withdrawn one from another, as represented in FIG. 1C.

Returning to FIG. 6, as will be described herein, the specific sub-systems of die feeder 610 have specific tolerances to accept and present die while maintaining orientation and position of the die during the die hand-off operations; i.e. die acquisition from the wafer, die flipping and lastly die transporting to the pick and place machine used for high-speed circuit board manufacturing. A direct die feeder as disclosed in U.S. Pat. No. 6,173,750, and previously incorporated by reference, uses conventional pick nozzles having a planar forward surface whereby a vacuum seal on the face of the die is used to reliably secure, index and transfer conventional die throughout the die handling process. It is further appreciated, therefore, that motion-imparting devices such as motors, actuators, solenoids and the like are required to move the nozzles to and from the various positions to effect movement of the die from one location to another.

As generally illustrated in FIGS. 2A–3C, the present invention provides a vacuum gripper wherein mating surfaces of the grippers form a nest or cavity and thereby provide the capability to accurately maintain the position of die relative to the vacuum gripper and releasing said die onto a mating nozzle, without allowing the die to become dislocated from the feed path centerline as the die is transitioned to/from the nozzles within the vacuum gripper.

Notably, the die can be transferred between the nozzles of the present invention in either direction by reversing the air flow to the nozzles (e.g., compare FIGS. 2A–C to FIGS. 3A–C), wherein the nozzle with positive pressure passes the die to the nozzle with an applied negative pressure or vacuum. As a function of the precision afforded by controlling the position of the nozzle and the die between the nozzles, the present invention provides highly accurate die positioning and increases the throughput by reducing or eliminating a transfer time or settling delay. The system to which die are being fed (e.g., circuit board assembly machine), also encounters fewer pick-up errors and thereby improves overall throughput. Moreover, the novel cavity die transfer design enables the die feeder to be constructed without an elaborate mechanical gripper or collet die transfer system, saving both cost and valuable space in the die feeder 610.

Figure 2C:
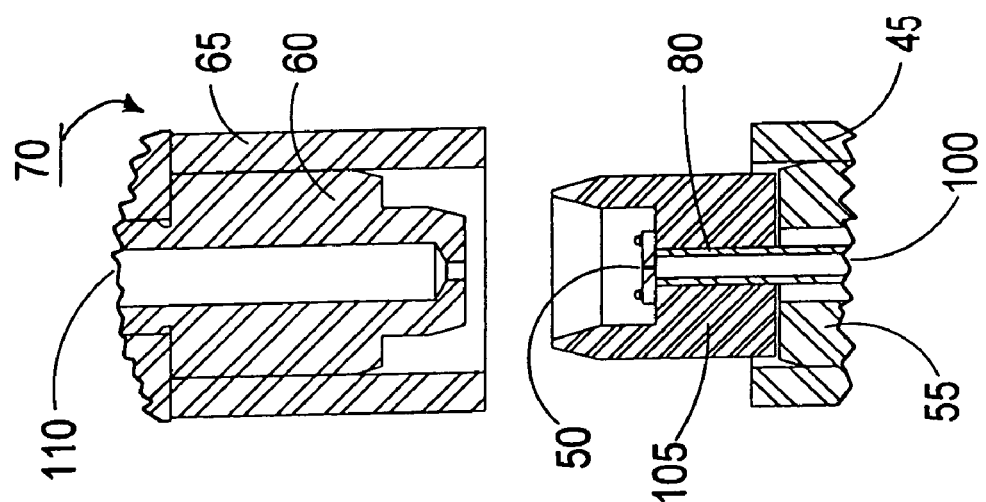
FIG. 2C is a is a cross sectional view showing the completed transfer of the die onto the cavity nozzle.
Figure 2B:
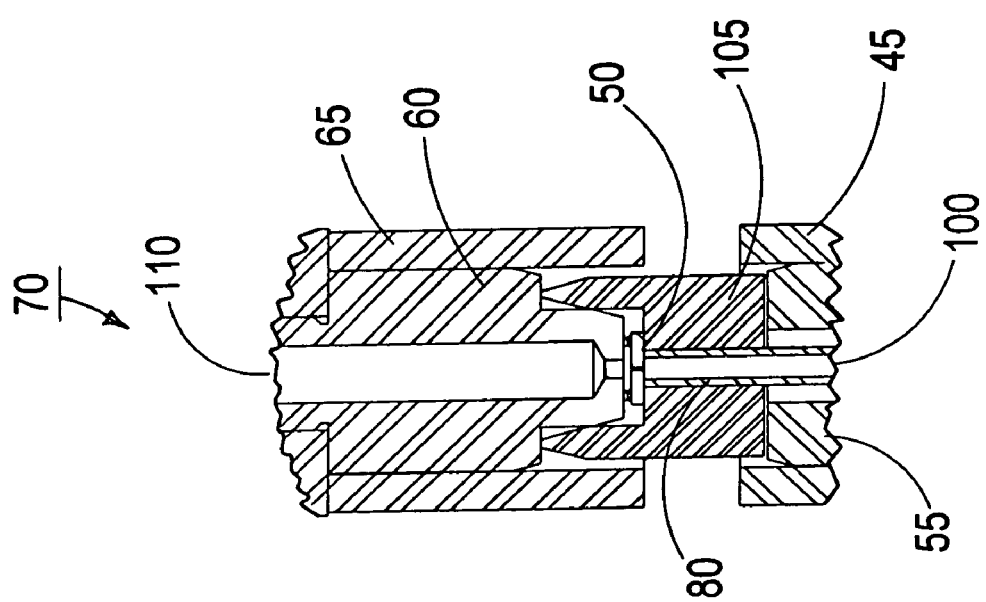
FIG. 2B is a cross sectional view demonstrating the interaction of the nozzles at the time of transfer.
Figure 2A:
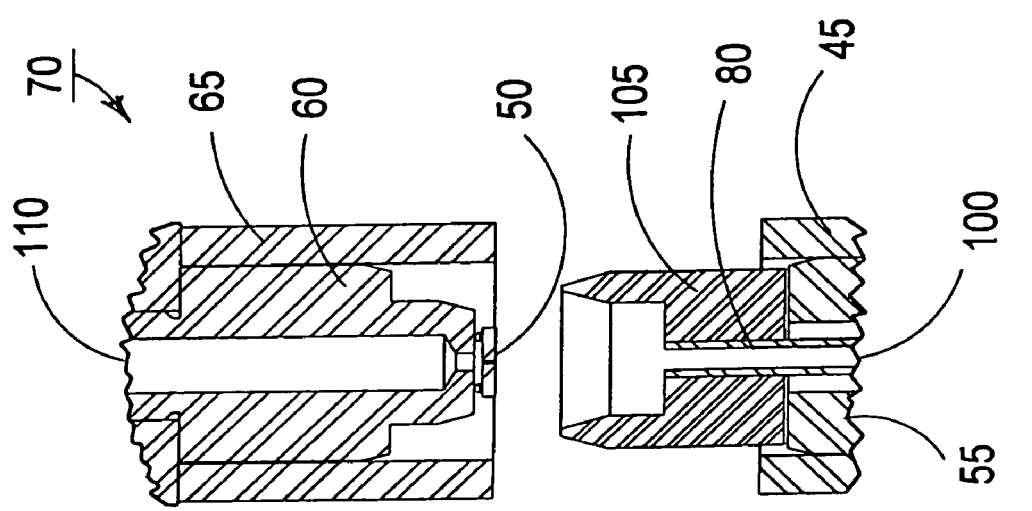
FIG. 2A is a cross sectional view showing a die staged on the mating nozzle for transfer to the cavity nozzle.

FIGS. 2A–C illustrate a die transferring apparatus utilizing a die gripper 70 having a cavity nozzle 105 and an associated mating nozzle 60 in accordance with the present invention. The invention is being used in cooperation with a high speed die feeder shown in FIGS. 4 and 6 comprising numerous motion devices and a computer control system to facilitate the operation of die gripper 70 from its retracted position shown in FIGS. 2A and 2C, to an extended position as seen in FIG. 2B. Additionally, a pneumatic valve system is provided to accommodate the air flow to and from the nozzles. As will be appreciated by those familiar with pneumatic systems, the air pressure of such systems may be negative (vacuum) or positive, and the pressure level may be rapidly altered in both direction and magnitude using valves and the like.

The upper portion of the vacuum die gripper 70, as seen in FIG. 2A comprises an outer housing 65 having a center bore along much of its length. In operation, housing 65 is disposed along a central longitudinal axis oriented substantially perpendicular to the surface of die 50. A mating nozzle 60 is located in a concentric relationship within outer housing 65 and retains die 50 with vacuum. Air manifold 110 provides both air pressure and vacuum to the tip of mating nozzle 60.

The upper assembly of gripper 70 reciprocates downwardly along the longitudinal axis of the mating nozzle 60 between a first, retracted position, as seen in FIG. 2A, and a second, extended position, as seen in FIG. 2B. Reciprocation means is not shown, but is facilitated in a manner well understood in the art using either a mechanical device such as a solenoid or a pneumatic actuator as disclosed in U.S. Pat. No. 6,173,750, and incorporated herein by reference.

The lower section of vacuum gripper 70 comprises a cavity nozzle 105, nozzle support 55, nozzle collar 45 and air tube 100. Nozzle support 55 contains therewithin an airway terminating at a first end orifice in airway 100 and the opposite end being attached to a pneumatic source. Operatively positioned within the airway 100, and extending inward is a removable cavity nozzle 105. In certain embodiments of the present invention, the cavity nozzle 105, and/or the mating nozzle 60 are removable from the die transferring apparatus. Similarly, the tips of the respective nozzles may be made so as to be removable from the nozzles themselves or from the apparatus. By being removable, the respective nozzles or tips may be replaced if damaged or worn, and they may also be replaced so as to provide nozzles with different tip characteristics for the die transfer apparatus. For example, the relative shape and size of the tip characteristics may be modified for die of different shapes and sizes.

Accumulated mechanical tolerances potentially effect the engagement of the mating nozzle 60 within the cavity nozzle 105. Therefore, a means for lateral displacement is provided to accommodate alignment, whereby the positioning of the cavity nozzle 105 within the outer housing 45 is somewhat flexible by virtue of the lateral compliancy of the tube 80. The outer housing 45 constrains the cavity nozzle 105 displacement by providing a maximum deflection limit, for example +/−0.010 mm. Tube 80 is made from a high tensile strength material with high elastic deformation limits, thereby allowing for significant lateral deflection of tube 80. For example, tube 80 may be considered be similar to a hypodermic needle. Accordingly tube 80, with the cavity nozzle 105 attached thereto, displaces at least laterally so as to compensate for any interference due to an axial misalignment of the mating nozzle 60 and the cavity nozzle 105 of gripper 70. In this manner, the cavity nozzle and the mating nozzle conform to one another to provide alignment during the engagement of the two nozzles The lower portion of vacuum gripper 70 comprises a cavity nozzle 105 contained within housing 45. Beveled edges 52 and 54 along the circumference of the frontal surface of both nozzles assist in the mating as cavity nozzle 105 compensates for any potential misalignment. Once the cavity nozzle 105 is fully engaged with mating nozzle 60 and die 50 is interposed therebetween, the vacuum at airway 110 is switched to a positive pressure while a vacuum is simultaneously drawn on airway 100 of the cavity nozzle 105. Die 50 is now transferred and under the control of cavity nozzle 105 as the mating nozzle 60 retracts to disengage the nozzles as shown in FIG. 2C with die 50 contained within cavity nozzle 105.

Referring now to FIG. 3A the specific construction of flip vacuum gripper 90, now shown in an alternative configuration, is a variation to the aforementioned gripper 70 whereby the die exchange process is reversed and the die is transferred from the cavity nozzle 105 to the mating nozzle 60. Vacuum gripper 90 comprises an upper portion whereby the cavity nozzle 105 is attached to nozzle post 55 and contained within collar 45. This upper portion reciprocates along the longitudinal axis of vacuum gripper 90. Reciprocation of the cavity nozzle 105 is accomplished using either a mechanical or pneumatic actuator. While reciprocation of one nozzle is described, it will be appreciated that one, both, or alternating movement may be employed to achieve relative motion of the cavity nozzle 105 to the mating nozzle 60. The lower portion of flip vacuum gripper 90 contains mating nozzle 60 in a concentric relationship within the outer housing 65. The vacuum gripper 90 is disposed so that a central longitudinal axis thereof is oriented substantially perpendicular to the surface of the die 50; The cavity nozzle 105, nozzle post 55 and nozzle collar 45 reciprocate in unison along the longitudinal axis between a first, retracted position, as seen in FIG. 3A, and a second extended position, as seen in FIG. 3B.

The nozzle post 55 contains therein an airway 100 having an opening on either end, whereas the distal end is attached to a pneumatic source and an inward orifice having a removable cavity nozzle tip 105 attached thereto. Die 50 is secured to cavity nozzle 105 as a result of the vacuum applied through airway 100 connected to an air control valve (not shown). As in gripper 70 a means for lateral displacement of cavity nozzle 105 may be required to accommodate any misalignment between the nozzles. The positioning of cavity nozzle 105 within collar 45 is made to be somewhat flexible by virtue of the deflection of air tube 80. The collar 45 constrains the cavity nozzle 105 by providing a maximum displacement limit. Accordingly, the flexible air tube 80 is constructed from material having elastic deformation limits well in excess of the maximum deflection. Air tube 80, with the cavity nozzle 105 attached thereto, displaces laterally so as to compensate for any radial misalignment of the mating and cavity nozzles. Beveled edges 52 and 54, along the circumference of the frontal surface of both nozzles, assists in the mating as cavity nozzle 105 compensates for any radial misalignment. Once the cavity nozzle 105 is fully engaged with the mating nozzle 60, the vacuum at airway 100 is switched to a positive pressure and simultaneously a vacuum is drawn on airway 100 of the cavity nozzle 105. Die 50 is now under the control of the mating nozzle 60 as cavity nozzle 105 retracts to disengages the nozzles as shown in FIG. 3C.

Figure 4A:
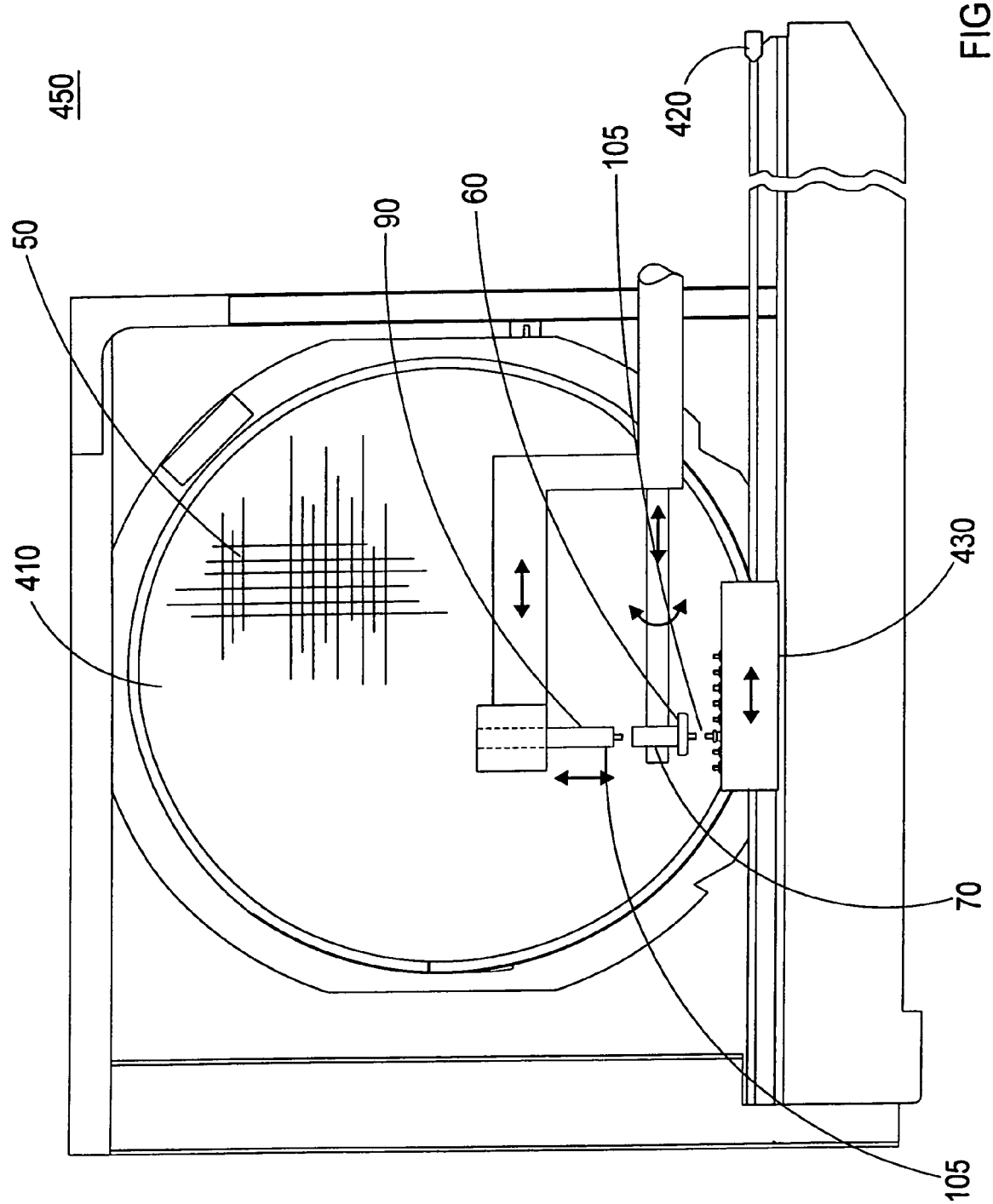
FIG. 4A is a planar view of a die feeder showing the wafer, pick, flip and shuttle nozzle.
Figure 4B:
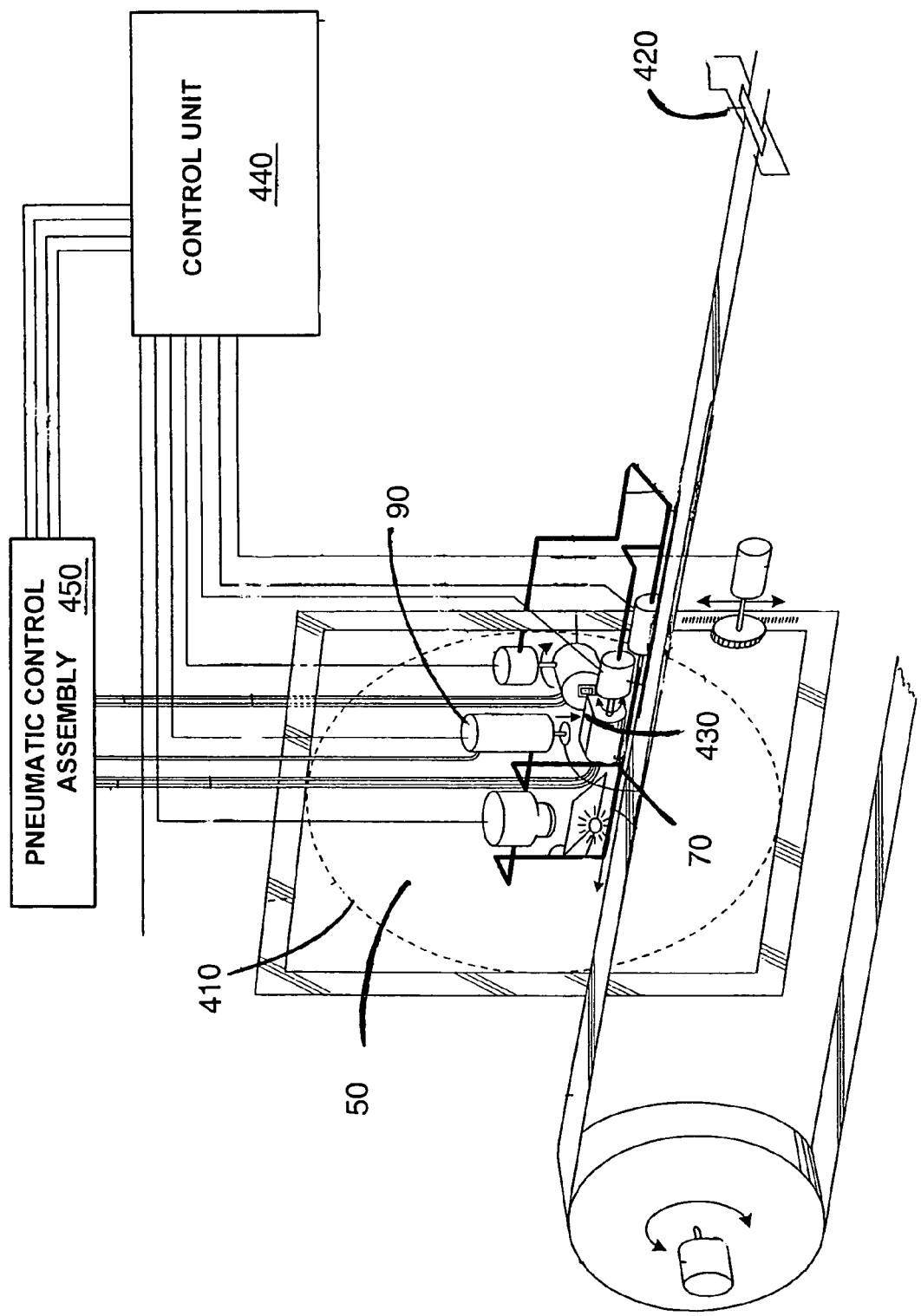
FIG. 4B is a schematic diagram of the pneumatic control system

In order to provide compliance to the normal force applied on the surface of the die by both nozzles provisions for over travel along the Z-axis is provided so as to limit and control the maximum allowable normal contact force to minimize the potential for cracking die 50 by the nozzles Now as seen in FIG. 4, a die feeding apparatus 450, employing die grippers 70 and 90, in accordance with the present invention, transfers die 50 from wafer 410 to pick point 420.

Mating nozzle 60 of gripper 70 receives die 50 from wafer 410. Cavity nozzle 105 accepts die 50 from mating nozzle 60 at the time the nozzle pair are fully aligned, engaged and the vacuum is removed and air pressure is applied to the mating nozzle tip 60, while vacuum is supplied to the cavity nozzle. Die gripper 70 has been formed and positioned so as to contact at least a portion of the peripheral surfaces of the die, such as the exposed side of die 50, whereby vacuum is released and positive pressure is applied. While vacuum is concurrently presented to the cavity nozzle die 50 is contained within cavity nozzle 105 which now becomes the upper section of gripper 90. Cavity nozzle 105 extends downwardly to engage mating nozzle 60 within die shuttle 430. Die 50 is acquired by mating nozzle 60 of shuttle 430 and subsequently transferred to pick point 420. In the alternative, if the die is to be placed with the circuit side up only gripper 70 is required whereas die 50 is taken from the wafer and passed directly to cavity nozzle 105 within the die shuttle 430.

Figure 5:
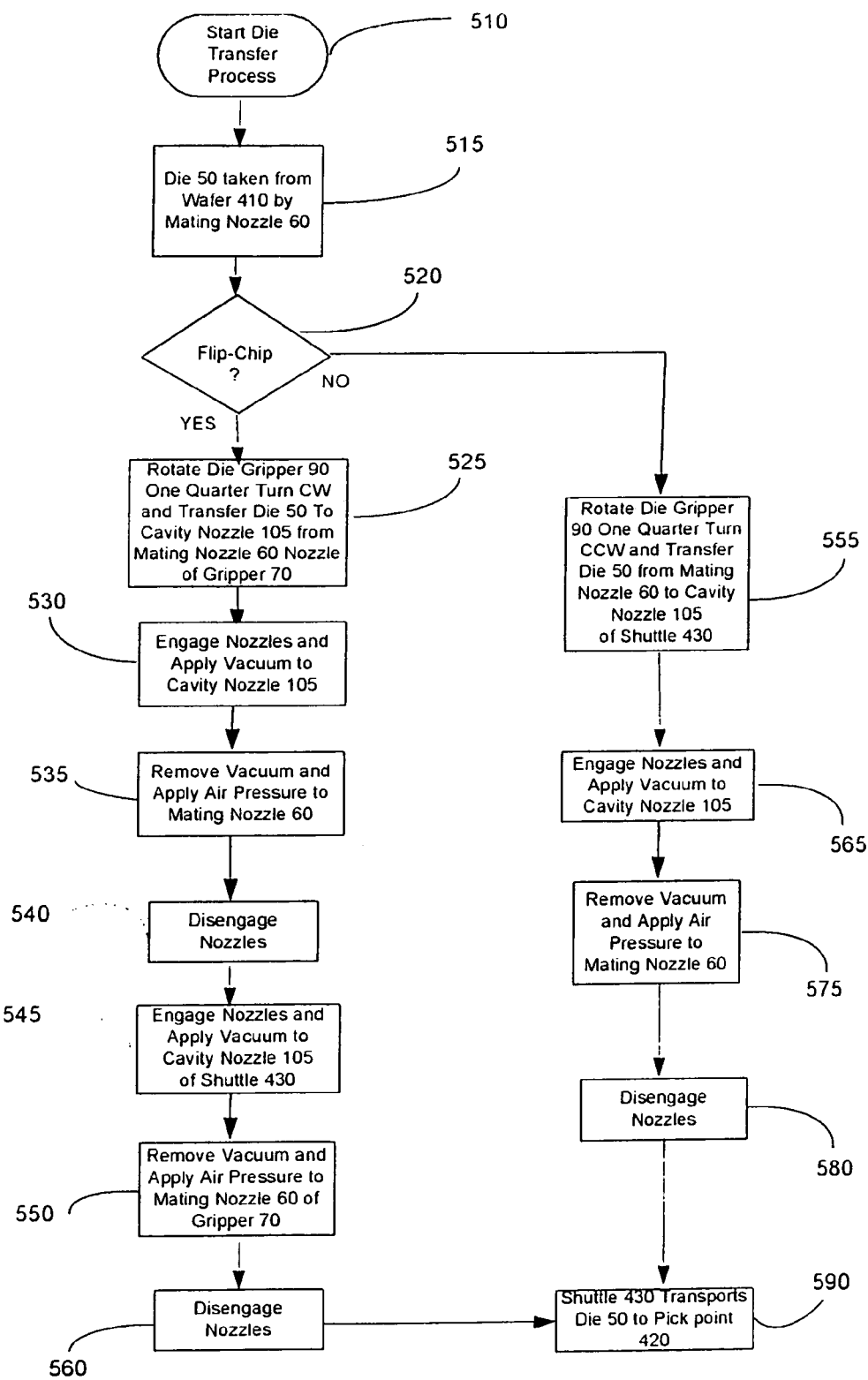
FIG. 5 depicts a method flow chart for die transferring between nozzles within a die feeding apparatus.

In FIG. 5 the flow chart depicts various steps of the die transfer method discussed previously with respect to the die gripper. The process begins at 510 at which time there has been a die extracted from a wafer and acquired by a mating nozzle 60. As discussed above, there may be a requirement to deliver the die with either the circuit side up or down. Therefore, at decision step 520 the logic within the process and pneumatic control system determines if the die is a "flip chip" and thereby requires the additional transfer steps starting at step 525. In the case of a circuit up requirement, the die is transferred using vacuum gripper 70, where die 50 is transferred directly from mating nozzle 60 to cavity nozzle 105 on shuttle 430 for subsequent presentation using shuttle 430 to convey die 50 to pick point 420. In the alternative, if the circuit side is to be presented down, vacuum gripper 90 receives die 50 from mating vacuum nozzle 60. In steps 530–540, 545–560 and 565–580 nozzles are engaged, air is reversed and the nozzles disengaged with the die 50 having been transferred from one to the other. In step 530, 540 and 565, as mating nozzle 60 moves towards cavity nozzle 105 the nozzles subsequently adjust to a common axis so as to allow their uninhibited engagement.

The present invention, thus, is a versatile vacuum gripper for accomplishing the reliable and accurate exchange of microscopic die between a pair of nozzles. Additionally the tips of the air nozzles can be "changed" rapidly and efficiently to accommodate a prolifera of die form factors.

It is, therefore, apparent that there has been provided, in accordance with the present invention, a method and apparatus for the conveyance of small die or similar components at high speeds in a die feeding system. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

In recapitulation, the present invention is a method and apparatus for a novel cavity embedded within a nozzle for locating and nesting a die against a vacuum port and releasing same without allowing the die to become displaced, misaligned or otherwise gone astray.

What is claimed is:

1. A die gripper for transferring die within a die feeder, comprising:
   a cavity nozzle, said cavity nozzle including a tip with a hollow space formed within said tip to constrain the die along at least the frontal surface of the die; and
   a mating nozzle, positioned opposite said cavity nozzle, including a tip suitable for mating at least partially within said cavity nozzle, wherein relative motion between said cavity nozzle and said mating nozzle along a longitudinal axis of the die gripper brings said nozzles into contact with one another, such that a die retained on one of said nozzles may be transferred to the other of said nozzles while said cavity nozzle and said mating nozzle are engaged.

2. The apparatus of claim 1, wherein said tip of said cavity nozzle is removable.

3. The apparatus of claim 1, wherein the tip of said mating nozzle is removable.

4. The apparatus of claim 1, wherein said cavity nozzle and said mating nozzle conform to one another to provide alignment during the engagement of the mating nozzle within the cavity nozzle along a longitudinal axis of said die gripper.

5. The apparatus of claim 1, wherein the cavity nozzle is independently capable of maintaining a die, secured thereto with vacuum, in a consistent orientation, and in response to release of the vacuum, releasing the die without altering said orientation.

6. A vacuum die gripping apparatus, comprising:
   a cavity nozzle;
   a mating nozzle including an outer housing, a generally tubular inner member positioned therein and extending outwardly from the outer housing through an open end thereof; said inner member having an airway that provides pneumatic communication at a tip thereof;
   the outer member and inner member being adapted to move between a retracted position and an extended position, wherein at least said inner member extends outwardly along a longitudinal axis of the die gripping apparatus; and
   a means for connecting a source of pressurized air to the airway of the inner member.

7. The device of claim 6, wherein said inner member is a tube interposed between an interior of the outer housing and the nozzle.

8. The device of claim 7, wherein the tube of said inner member is flexible to allow relative motion between the cavity nozzle and the mating nozzle about the longitudinal axis of the die gripper.

9. The device of claim 6, wherein said tip of the inner member, is removable and has a die cavity therein.

10. A die transporting path within a die feeder comprising;
    a die pathway lying between a first location in proximity to a die wafer and a distal pick location;
    a die transfer means for passing a die between two or more nozzles;
    a vacuum die gripper having a mating nozzle;
    whereas said mating nozzle has a die contained therewithin; and
    a cavity nozzle nesting within the mating nozzle having a die captured therebetween.

11. The device of claim 10 wherein the die cavity nozzle displaces so as to directly align with the mating nozzle during engagement.

12. The device of claim 10, wherein the mating nozzle moves in line with die cavity nozzle once the die is contacted.

13. In a die feeding system for supplying the die to an automated circuit board assembly apparatus, said system having one or more die grippers, each comprising a pair of engaging nozzles, whereby said nozzles capture and pass a die therebetween from a wafer to a pick-up location, the method of presenting die for retrieval at the pick-up location comprising the steps of:
    removing the die from the wafer with the nozzle;
    engaging the pair of nozzles within the die gripper;
    transferring the die between nozzles within the die gripper; and
    transporting the die to a pick-up location.

14. The method of claim 13, wherein said transferring step employs a pair of nozzles, one of which having a cavity therein.

15. The method of claim 13, wherein said engaging step further comprises:
    applying a vacuum to the mating nozzle;
    once engaged, apply air pressure to the mating nozzle;
    applying a vacuum to the cavity nozzle; and
    retracting the nozzles one from another.

16. The method of claim 15 further comprising the step for compensating the radial misalignment of the mating and cavity nozzles.

* * * * *